United States Patent [19]

Lindsay

[11] Patent Number: 4,593,342
[45] Date of Patent: Jun. 3, 1986

[54] HEAT SINK ASSEMBLY FOR PROTECTING PINS OF ELECTRONIC DEVICES

[75] Inventor: Paul H. Lindsay, Vernon, N.Y.

[73] Assignee: General Electric Company, Portsmouth, Va.

[21] Appl. No.: 671,619

[22] Filed: Nov. 15, 1984

[51] Int. Cl.[4] .............................................. H05K 7/20
[52] U.S. Cl. ...................................... 361/386; 357/81; 361/387; 361/400
[58] Field of Search .............. 357/79, 81; 174/16 HS; 361/386–389, 400, 405, 417, 419

[56] References Cited

U.S. PATENT DOCUMENTS

| | | | |
|---|---|---|---|
| 3,327,180 | 6/1967 | Winter | 357/81 |
| 4,004,195 | 1/1977 | Harayda et al. | 317/100 |
| 4,054,901 | 10/1977 | Edwards | 174/16 HS |
| 4,159,506 | 6/1979 | Latasiewicz | 361/419 |
| 4,167,031 | 9/1979 | Patel | 361/386 |
| 4,204,248 | 5/1980 | Proffit | 361/388 |
| 4,321,423 | 3/1982 | Johnson | 361/386 |

Primary Examiner—G. P. Tolin

[57] ABSTRACT

An electronic device, such as an integrated circuit chip, having pins for connection to a circuit board or the like is secured to a relatively massive heat sink. The heat sink is releasably secured to support means such that the electronic device and its pins are substantially isolated from forces related to the mass and weight of the heat sink.

7 Claims, 2 Drawing Figures

HEAT SINK ASSEMBLY FOR PROTECTING PINS OF ELECTRONIC DEVICES

BACKGROUND OF THE INVENTION

1. Field of the Invention

This invention relates to heat sink assemblies for use with electronic devices having pins adapted for connection to a circuit board and, more particularly, to means for supporting a relatively massive heat sink for electronic devices such that the pins and their connections to the circuit board are substantially isolated from forces related to the mass of the heat sink.

2. Description of the Prior Art

In many applications of electronic circuits, substantial heat is generated during operation and must be efficiently removed from the electronic devices in order to avoid overheating of the devices and resulting failure or improper operation. One popular and effective way of removing heat is to mount a heat generating electronic device in intimate heat exchange relationship with a heat sink capable of rapidly conducting heat away from the electronic device. Heat sinks are commonly relatively massive blocks of heat conducting metal having heat radiating fins or the like. In practice, heat sinks may have much greater mass than the electronic devices, such as integrated electronic circuits, from which they are conducting heat. In most electronic circuits, this situation does not create problems. However, in consumer electronic products such as portable radios and portable combination radio/tape players and recorders, the product is often subjected to substantial and sometimes vigorous movement, such as might occur if the consumer swings the product back and forth in time with music being played over the product. If in such a product an integrated circuit or the like has its output pins or leads connected to a circuit board by conventional techniques such as dip soldering and a massive heat sink is mounted on and supported by the integrated circuit, large forces resulting from acceleration and deceleration of the heat sink will be transmitted to the pins and their connections to the circuit board. Since the pins of such electronic devices are relatively delicate, they can be easily broken or torn loose as a result of even moderate motion of the product, the result being failure of the product. This problem can be overcome by mounting the electronic device on an independently supported heat sink, and then connecting its pins or leads to the remainder of the circuit by means of discretely wired flexible connectors. While this solution prevents the placing of significant stress on the pins, it is not entirely satisfactory, however, in that it does not take advantage of modern, high production techniques for inexpensively and reliably connecting the pins directly to the circuit board and the circuitry provided thereon.

SUMMARY OF THE INVENTION

It is a primary object of this invention to provide a heat sink assembly and related method that provides effective heat transfer from an electronic device without subjecting the device to unacceptable pin loading.

Another object of this invention is to provide in a consumer electronics product a heat sink assembly in which a heat sink and an electronic device are secured together in heat exchange relationship and the electronic device is connected directly to a circuit board without subjecting the pins of the electronic device to significant forces resulting from the mass of the heat sink.

Yet another object is to provide the foregoing objects by means of a method that permits easy assembly and disassembly of a heat sink assembly.

Briefly stated, in carrying out the invention in one form, a heat sink assembly is provided for an electronic device having pins adapted for connection to a circuit board. The heat sink assembly includes a relatively massive heat sink having a surface thereon for contacting in intimate heat exchange relationship the side of the electronic device remote from the circuit board. A support means is secured to the circuit board, and a first securing means is provided for releasably securing the electronic device to the heat exchange surface. A second securing means is provided for releasably securing the support means to the heat sink such that the support means supports the heat sink from the circuit board in a substantially rigid manner. As a result, the heat sink is substantially borne by the support means such that the pins of the electronic device and the connections thereof to the circuit board are substantially isolated from forces resulting from the mass of the heat sink. In accordance with further aspects of the invention, the support means is positioned on at least one side of the heat sink in a manner such that, upon release of the first and second securing means, the heat sink can be removed from the circuit board without requiring removal from the circuit board of either the support means or the electronic device. The heat exchange surface is a substantially planar surface, and the support means comprises a pair of support members positioned on opposite sides of the heat sink. The first securing means comprises at least one screw extending through the electronic device from the circuit board side thereof into the heat sink, the screw being accessible for removal thereof through an opening in the circuit board. The support members are in a preferred embodiment metal plates secured to the circuit board in planes substantially normal to the plane of the heat exchange surface.

In accordance with still further aspects of the invention, a method of mounting a relatively massive heat sink for an electronic device includes the steps of rigidly mounting the heat sink on the circuit board with the heat sink supporting the electronic device in a substantially fixed position relative to the circuit board and thereafter connecting the pins of the electronic device to the circuit board. The method further includes a preliminary step of providing a plurality of openings in the circuit board for receiving respective ones of the pins of the electronic device. The rigid mounting step includes in any order the substeps of releasably securing the electronic device to the heat sink in intimate heat exchange relationship, releasably securing the heat sink to the support means, and locating the support means in a fixed position on the circuit board. In accordance with another aspect of the invention, the method further comprises a step of securing the support means to the circuit board in the fixed position, this step being performed prior to or simultaneously with the step of connecting the pins to the circuit board.

BRIEF DESCRIPTION OF THE DRAWINGS

While the novel features of the invention ar set forth with particularity in the appended claims, the invention, both as to organization and content, will be better understood and appreciated, along with other objects and features thereof, from the following description taken in connection with the drawings, in which:

DESCRIPTION OF A PREFERRED EMBODIMENT

Figure 1:
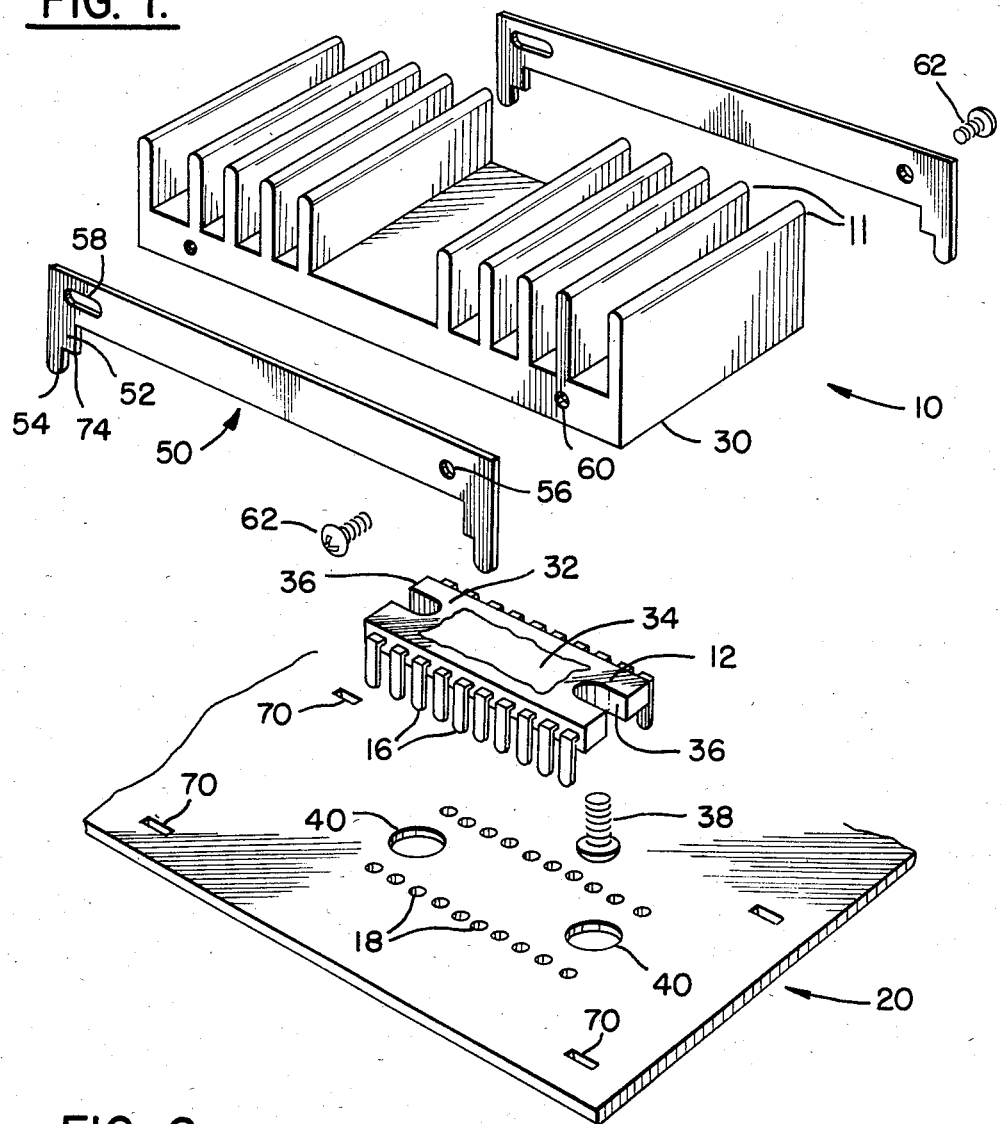
FIG. 1 is an exploded pictorial view of a heat sink assembly incorporating the structure and method of the present invention.
Figure 2:
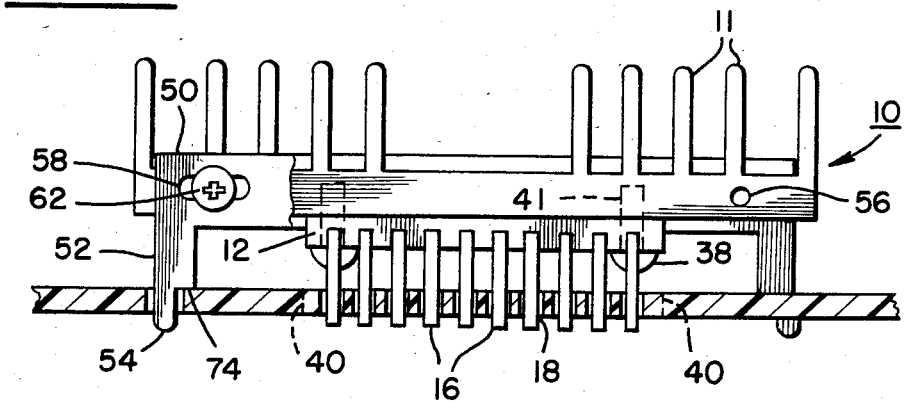
FIG. 2 is a side view of the heat sink assembly of FIG. 1 in its fully assembled state, a portion of one support bar being cut away.

As shown by FIGS. 1 and 2, a heat sink 10 having heat radiating fins 11 thereon is provided for conducting heat away from an electronic device 12, which is illustrated as the package 12 of an integrated circuit chip. Hereinafter, the package 12 will be sometimes referred to as being an integrated circuit. The integrated circuit 12 is provided with a number of electric leads or pins 16 which project into and through respective openings 18 in a circuit board 20. When the integrated circuit 12 is positioned on the circuit board in the manner hereinafter described, the pins 16 may be dip soldered to electrically connect the pins 16 and the integrated circuit to circuitry provided on the circuit board 20, such as by copper strips thereon. The soldering techniques used to join pins from integrated circuits and other electronic devices to circuit boards are well known in the art and do not constitute a part of the invention. The present invention, however, makes it possible to connect the pins 16 to the circuit board 20 by conventional techniques without risk of stress induced breakage of the pins 16 or their connections to the circuit board 12 or delamination of the copper strips on the circuit board leading to the pins 16.

To insure good heat transfer between the integrated circuit 12 and the larger and much more massive heat sink 10, the heat sink is provided with a planar surface 30 for intimate heat exchange contact with a planar surface 32 on the side of the integrated circuit 12 remote from the circuit board 20. A pair of slots 36 are provided in opposite ends of the integrated circuit chip package 12, and screws 38 extend therethrough from the circuit board side of the chip into threaded openings 41 in the heat sink 10 to securely clamp the integrated circuit 12 to the heat sink 10. A layer of conductive grease 34 or the like may be provided between the surfaces 30 and 32 to enhance still further the rate of heat transfer between the clamped planar surfaces 30 and 32 of the integrated circuit 12 and heat sink 10, respectively. In accordance with the method of the invention, the electronic device or integrated circuit 12 is initially clamped to the heat sink 10, and both the heat sink 10 and the integrated circuit 12 are positioned in their final fixed locations relative to the circuit board 20 before the pins 16 of the integrated circuit 12 is permanently connected to the circuit board 20.

As indicated previously, the circuit board 20 has plurality of openings 18 for receiving respective ones of the pins 16. In addition, a pair of openings 40 are provided in the circuit board 20 in alignment with the screws 38 when the pins 16 are received in the openings 18. The openings 40 have diameters greater than the diameters of the heads of the screws 38 so that the screws 38 can be removed through the openings 40 after the integrated circuit 12 is permanently attached to the circuit board 20.

A pair of support members 50 are positioned on opposite sides of the heat sink 12 to rigidly support the heat sink 10 on the circuit board 20. Each of the support members 50 is a flat metal plate or bar extending substantially along the entire length of the side of the heat sink 10. At each end of the bars 50, a depending arm 52 terminates in a tab 54. Each of the support bars 50 has a circular opening 56 at one end thereof and a slotted opening 58 at the other end thereof. When the support members 50 are abutted against the sides of the heat sink 10, the openings 56 and the slotted openings 58 are aligned with threaded openings 60 in the heat sink 10. The heat sink 10 is secured to the support members 50 by means of screws 62 extending through the openings 56 and 58 into the openings 60, the openings 56 and 58 being sized such that the support members 50 are clamped between the heat sink 10 and the heads of the screws 62. When the bars 50 are clamped to the heat sink 10, the tabs 54 at the opposite ends of the bars 50 may be inserted into respective openings 70 in the circuit board 20, the openings 70 being sized to receive the tabs 54, but not the larger, upper portions of the depending arms 52. More particularly, when the tabs 54 are inserted into the openings 70, edge surfaces 74 abut the top surface of the circuit board 20 to position the heat sink 10 in a fixed position relative to the circuit board 20. When the tabs 54 are received in the openings 70 the metal plates or bars 50 are disposed in planes substantially normal to the plane of the heat exchange surface 30 of the heat sink 10.

In the practice of the invention in one form, the integrated circuit 12 is initially clamped to the heat sink 10 by the screws 38, and the support members 50 are clamped to the heat sink 10 by the screws 62. Thereafter, the composite assembly is placed in its final fixed position on the circuit board 20 with the tabs 54 extending into the openings 70 and the pins 16 extending into the openings 18. The pins 16 and the tabs 54 may then be simultaneously soldered to the circuit board 20. The support members 50 are sufficiently strong and rigid to support the heat sink 10 in a substantially rigid manner. As a result, the weight of the heat sink 10 and the forces resulting from the mass of the heat sink are transmitted to the circuit board 20 through the arms 52 and the tabs 54. The heat sink 10 is thus substantially borne by the support elements 54 such that the pins 16 of the electronic device 12 and the connections of the pins 16 to the circuit board are substantially isolated from the mass of the heat sink 10 and forces resulting from the weight of the heat sink and its acceleration or deceleration during use.

In the foregoing description, a preferred method of the invention has been set forth. More specifically, in accordance with the preferred method, the integrated circuit 12 is initially secured to the heat sink 10, the support members 50 are secured to the heat sink 10, and the composite assembly is thereafter soldered to the circuit board 20. In a broader sense, the invention resides in the concept of rigidly supporting the integrated circuit 12 from the heat sink 10 in a fixed position relative to the circuit board 20 and thereafter soldering the leads 16 of the integrated circuit 12 to the circuit board 20. Accordingly, the support members 50 can be initially secured to the circuit board 20, and the composite of the heat sink 10 and the integrated circuit 12 can then be secured to the support members 50. Thereafter, the pins 16 can be connected to the circuit board 20. Alternatively, the integrated circuit 12 can be placed loosely in position with the pins 16 extending into the openings 18. Thereafter, the heat sink 10 can be rigidly secured in position, after which the integrated circuit 12 can be secured thereto by the screws 38. Finally, the pins 16 can be soldered to the circuit board 20 at the openings 18. In each of these alternatives, the integrated circuit 12 is rigidly supported in a fixed location relative to the circuit board 20 prior to the connection of its pins 16 to the circuit board 20 and the circuitry contained thereon. As a result, the pins 16 are substantially isolated from the weight of the heat sink 10 and forces resulting from the mass of the heat sink.

If it is subsequently desired to remove the heat sink 10 for any reason, the screws 38 ma be removed through the openings 40 to release the integrated circuit 12 from the heat sink 10. The screws 62 can then be removed to release the heat sink 10 from the support base 50. The heat sink 10 may then be lifted off of the board 20 from between the support bars 50, leaving the chip 12 and the support bars 50 permanently secured to the circuit board 20. If it is desired to replace the integrated circuit chip 12, it can then be carefully removed and replaced with a new chip having pins 16 extending loosely into the openings 18. The heat sink 10 and the new chip 12 can then be reassembled into a rigid assembly by means of the screws 38 and 62. Thereafter, the pins 16 of the new chip 12 may be permanently secured to the circuit board in the manner described above. Since the heat sink 10 is rigidly mounted in a fixed position prior to the step of connecting the pins 16 to the circuit board 20, the pins will be substantially isolated from the forces related to the weight and mass of the heat sink.

From the foregoing, it will be seen and appreciated that the apparatus and method of the invention provides effective heat transfer from an electronic device to an attached, relatively massive heat sink without subjecting the device to unacceptable pin loading and stress.

While the invention has been particularly shown and described with reference to preferred embodiments thereof, it will be understood by those skilled in the art that various changes in form, detail, and application may be made without departing from the spirit and scope of the invention. Accordingly, it is intended that all such modifications and changes be included within the spirit and scope of the appended claims.

What is claimed as new and is desired to secure by Letters Patent of the United States is:

1. A heat sink assembly including an electronic device having pins connected to a circuit board, said electronic device having a generally planar configuration with one side parallel to and adjacent said circuit board and one side parallel to and remote from said circuit board, said heat sink assembly comprising:

a relatively massive heat sink having a heat exchange surface thereon contacting in intimate heat exchange relationship the side of the electronic device remote from the circuit board, heat sink support means secured to the circuit board independently of said electronic device, first securing means releasably securing the electronic device to said heat exchange surface, and second securing means releasably securing said heat sink support means to said heat sink, said support means supporting said heat sink from the circuit board in a substantially rigid manner, whereby said heat sink is substantially borne by said suport means such that the pins of the electronic device and the connections thereof to the circuit board are substantially isolated from forces resulting from the mass of said heat sink.

2. A heat sink assembly as defined by claim 1 in which said support heat sink means is positioned on at least one side of said heat sink in a manner such that, upon release of said first and second securing means, said heat sink can be removed from the circuit board without requiring removal from the circuit board of either said support means or the electronic device.

3. A heat sink assembly as defined by claim 1 in which said heat exchange surface is a substantially planar surface and said support means comprises a pair of support members positioned on opposite sides of said heat sink, the alignment of said support members and said heat sink being such that, upon release of said first and second securing means, said heat sink can be removed from between said support members without requiring removal from the circuit board of either of said support members or the electronic device.

4. A heat sink assembly as defined by claim 3 in which said first securing means comprises at least one screw extending through the electronic device from the circuit board side thereof into said heat sink, said screw being accessible for removal thereof through an opening in the circuit board.

5. A heat sink assembly as defined by claim 3 in which each of said support members is a metal plate secured to the circuit board in a plane substantially normal to the plane of said heat exchange surface.

6. A heat sink assembly as defined by claim 5 in which said first securing means comprises at least one screw extending through the electronic device from the circuit board side thereof into said heat sink, said screw being accessible for removal thereof through an opening in the circuit board.

7. A heat sink assembly as defined by claim 6 in which said second securing means comprises screws extending through said support members into said heat sink.

* * * * *